(12) United States Patent
Lerman et al.

(10) Patent No.: US 10,844,757 B2
(45) Date of Patent: Nov. 24, 2020

(54) VALVE FOR INTERNAL-COMBUSTION ENGINES

(71) Applicants: Mahle Metal Leve S/A, Jundiai, SP (BR); Mahle International GmbH, Stuttgart (DE)

(72) Inventors: Pedro Martin Lerman, Rafaela (AR); Paulo Roberto Vieira De Morais, São Bernardo do Campo (BR)

(73) Assignees: Mahle Metal Leve S/A (BR); Mahle International GmbH (DE)

( * ) Notice: Subject to any disclaimer, the term of this patent is extended or adjusted under 35 U.S.C. 154(b) by 55 days.

(21) Appl. No.: 16/172,705

(22) Filed: Oct. 26, 2018

(65) Prior Publication Data

US 2019/0128150 A1 May 2, 2019

(51) Int. Cl.
*F01L 3/04* (2006.01)
*C23C 14/06* (2006.01)
*F01L 3/02* (2006.01)

(52) U.S. Cl.
CPC ............ *F01L 3/04* (2013.01); *C23C 14/0641* (2013.01); *F01L 3/02* (2013.01); *F01L 2301/00* (2020.05); *F01L 2303/00* (2020.05); *F01L 2820/01* (2013.01)

(58) Field of Classification Search
CPC . F01L 3/04; F01L 3/02; F01L 2101/00; F01L 2301/00; C23C 14/0641
See application file for complete search history.

(56) References Cited

U.S. PATENT DOCUMENTS

| 4,852,531 A | 8/1989 | Abkowitz et al. |
| 5,051,140 A | 9/1991 | Mushiake et al. |
| 5,441,235 A * | 8/1995 | Narasimhan ............ F01L 3/04 123/188.3 |
| 5,792,289 A * | 8/1998 | Morton ................. C22F 1/183 148/237 |
| 2006/0292386 A1* | 12/2006 | Itou ........................ F01L 3/04 428/469 |
| 2012/0305825 A1* | 12/2012 | Mori ...................... C22C 14/00 251/368 |

FOREIGN PATENT DOCUMENTS

| EP | 2963255 A1 | 1/2016 |
| JP | S61126312 A | 6/1986 |
| JP | 3018804 B2 | 3/2000 |
| WO | 9509932 A1 | 4/1995 |

OTHER PUBLICATIONS

English abstract for JP-S61126312.
English abstract for JP-3018804.
European search report dated Feb. 19, 2019.

* cited by examiner

*Primary Examiner* — Jacob M Amick
(74) *Attorney, Agent, or Firm* — Fishman Stewart PLLC

(57) ABSTRACT

A valve for an internal-combustion engine may include a body. The body may include a titanium alloy. At least one region of the body may include a nitrided layer. The nitrided layer may include at least one of titanium nitrides and aluminium-titanium nitrides.

20 Claims, 4 Drawing Sheets

VALVE FOR INTERNAL-COMBUSTION ENGINES

CROSS-REFERENCE TO RELATED APPLICATION

This application claims priority to Brazilian Application No. BR 102017014037-7, filed on Oct. 28, 2017, the contents of which are hereby incorporated by reference in its entirety.

TECHNICAL FIELD

The present invention relates to a valve for internal-combustion engines, in particular a titanium valve, in which at least one region of the valve has a nitrided layer formed by titanium nitrides and/or aluminium-titanium nitrides, providing excellent wear resistance and high hardness.

BACKGROUND

Nowadays, internal-combustion engines are subjected to increasingly high loads under extreme conditions, both high temperatures and/or high speeds, with a view to increasing the fuel efficiency of the engine or delivering more power. These loads cause severe wear to the components of the engines, in particular to alternating components, such as valves.

High-speed engines result in high levels of inertia in the movement of the valves, causing excessive wear of the components. For this reason, high-speed engines usually use valves made of a titanium-based material in order to reduce the weight of these components. The lighter weight and the greater strength at high temperatures of titanium alloys result in same being used in these valves, due to the inertial characteristics thereof However, titanium alone provides relatively limited wear resistance. In this regard, to increase the durability of the valve, a common approach is to use a steel cover known as a "lash cap" made of hardened carbon steel that can withstand wear and is usually used at the tip of the stem of the valve, a portion that is highly subject to wear.

Although very commonly used, the steel lash cap is a somewhat unsatisfactory solution for the problem of the low wear resistance of titanium. In particular at the tip of the valve, the assembly of the steel lash cap is a problem, since said lash cap may become removed from the valve when the engine is running. Since the engines that use titanium valves run at very high speeds, there is a very high level of inertia and the wear that may be caused between the parts can cause the steel lash cap to become detached and to cause significant damage to the engine.

In addition to improving the wear resistance of the tip of the valve, treating the valve seat can also improve the durability of the component in the most critical applications in terms of wear resistance combined with contact fatigue.

Patent document U.S. Pat. No. 5,051,140 discloses a method for treating a titanium or titanium-alloy surface comprising a process for pre-treating a workpiece comprising titanium or a titanium alloy with an acid to clean said workpiece, a heating process for heating the pre-treated workpiece in an oxidative atmosphere for a predetermined period of time to form a composite layer comprising oxide layers and oxygen-enriched layers on the surface of the workpiece, and a process for rapidly cooling the treated workpiece to remove a scale layer formed on the outermost layer of said composite layer on the surface of the workpiece. This method is limited in that it can only be applied to layers up to 10 microns thick and causes dimensional distortions as a result of the high heat treatment temperatures, as well as being a very slow method.

Patent document U.S. Pat. No. 4,852,531 discloses a valve for internal-combustion engines having a valve stem of a titanium alloy strengthened by the inclusion of a compound containing titanium such as titanium carbide (TiC), titanium boride (TiB) or titanium diboride (TiB$_2$). The valve stem is joined to a valve tip formed from a powder of a titanium alloy, preferably of the same composition as the alloy of the stem. The tip and the stem are joined by cold compaction followed by vacuum sintering and a high temperature compaction. However, this method uses expensive, explosive materials with a complex consolidation method, and the product has limited resistance.

Furthermore, patent document U.S. Pat. No. 5,441,235 discloses a valve made from titanium with an in situ zone of titanium nitride extending from the valve's outer surface by means of a plasma nitriding process. This solution is limited by the thickness of the coating, typically below 50 microns, investment in a costly technology and low nitride content.

There is therefore a need for a valve for internal-combustion engines, in particular a titanium valve, in which at least one region of the valve has a nitrided layer formed by titanium nitrides and/or aluminium-titanium nitrides, providing excellent wear resistance and high hardness and durability.

SUMMARY

A first objective of the present invention is to provide a valve for internal-combustion engines, in particular a titanium valve, in which at least one region of the valve has a nitrided layer formed by titanium nitrides (TiN) and/or aluminium-titanium nitrides (AlTiN$_2$).

Furthermore, the present invention is intended to provide a valve that has a nitrided layer that is up to 500 microns thick, with surface hardness of between 1100 HV and 2000 HV, and hardness of at least 700 HV to a depth of at least 200 microns in the thickness of the nitrided layer.

Furthermore, the present invention is intended to provide a valve that has a nitrided layer that comprises at least 50% by volume of titanium nitrides (TiN) and/or aluminium-titanium nitrides (AlTiN$_2$) to a depth of at least 50 microns in the thickness of the nitrided layer.

The present invention is also intended to provide a valve that is provided with a nitrided layer obtained by means of a nitriding process by laser remelting in a nitrogen-rich atmosphere.

Finally, the present invention is intended to provide a valve that has excellent wear resistance, with high hardness and durability, delivering properties that are superior to valves made from a titanium alloy.

The objectives of the present invention are achieved by a valve for internal-combustion engines provided with a body or substrate including a titanium alloy, in which at least one region of the valve has a nitrided layer formed by titanium nitrides (TiN) and/or aluminium-titanium nitrides (AlTiN$_2$), the nitrided layer comprising at least 50% by volume of titanium nitrides (TiN) and/or aluminium-titanium nitrides (AlTiN$_2$) to a depth of at least 50 microns in the thickness of the nitrided layer, that is up to 500 microns thick and has a surface hardness of between 1100 HV and 2000 HV, the hardness of the nitrided layer being at least 700 HV to a depth of at least 200 microns in the thickness of the nitrided layer, same being applied to all of the surfaces of the valve, in particular to a region corresponding to the tip of the valve; the substrate being made of the titanium alloy that contains between 5.5% and 6.75% by weight of aluminium, and between 3.5% and 4.5% by weight of vanadium, the remainder being titanium and impurities, or of a titanium alloy that contains between 5.5% and 6.75% by weight of aluminium, between 1.30% and 2.00% by weight of iron, between 0.07% and 0.13% by weight of silicon, and between 0.15% and 0.20% by weight of oxygen, the remainder being titanium and impurities, or of a titanium alloy that contains between 5.5% and 6.75% by weight of aluminium, between 2.4% and 3.00% by weight of tin, between 3.50% and 4.50% by weight of zirconium, between 0.35% and 0.50% by weight of silicon, and between 0.35% and 0.50% by weight of molybdenum, the remainder being titanium and impurities, or of a titanium alloy that contains between 5.5% and 6.75% by weight of aluminium, between 1.80% and 2.20% by weight of tin, between 3.60% and 4.40% by weight of zirconium, between 0.06% and 0.13% by weight of silicon, and between 1.80% and 2.20% by weight of molybdenum, the remainder being titanium and impurities; the valve being in particular an inlet valve.

The objectives of the present invention are also achieved by a method for obtaining a valve for an internal-combustion engine, the valve having a body or substrate made of a titanium alloy, the method including the following steps:

step i) forging and machining of the shape of the valve (1), step ii) nitriding of at least one region of the valve (1) to obtain a nitrided layer (10), step iii) finishing by machining, in which the nitriding step ii) is carried out by laser remelting in a nitrogen-rich atmosphere, an additional thermal oxidation and polishing step being optionally carried out on at least one region of the valve between steps i) and ii), the nitriding step ii) being carried out in an atmosphere containing at least 50% by volume of nitrogen using a laser beam with a diameter of between 0.5 and 6 millimetres, an angle of incidence of between 75° and 110°, a laser speed of between 5.0 and 60 millimetres per second, and a laser power of between 200 and 3000 watts, with a minimum nitrogen flow of 8 litres per minute, the step iii) of finishing by machining including removing material from the treated surface up to 70 microns deep.

Furthermore, the objectives of the present invention are achieved by an internal-combustion engine that includes at least one valve, as described above.

BRIEF DESCRIPTION OF THE DRAWNGS

The present invention is described in greater detail below on the basis of an example embodiment shown in the drawings. The figures show:

FIG. 1—Schematic side view of a valve with all of the component parts thereof,

FIG. 2—Schematic drawing of the nitrided layer applied to the valve according to the present invention, FIG. 3—Photograph of the tip of a valve treated with a nitrogen atmosphere and graphical representation of the elements that make up the nitrided layer obtained (sample A), FIG. 4—Photograph of the tip of a valve treated with no nitrogen atmosphere and graphical representation of the elements that make up the nitrided layer obtained (sample B), FIG. 5—Graphical representation of the hardness obtained for a valve treated with and without a nitrogen atmosphere and photograph of the nitrided layer, FIG. 6—Graphical representation of the content of the phases through the depth of the thickness of the nitrided layer for valves treated with and without nitrogen, FIG. 7—Graphical representation of the resulting depth of wear for valves with the nitrided layer obtained in the prior art and the nitrided layer obtained in the present invention, FIG. 8—Depth of wear measurements for a valve with the nitrided layer obtained in the prior art and the nitrided layer obtained in the present invention, and FIG. 9—Graphical representation of the content of phases through the depth of the thickness of the nitrided layer for the valve according to the present invention.

DETAILED DESCRIPTION

The present invention relates to a valve 1 for internal-combustion engines, in particular a titanium valve 1, in which at least one region of the valve 1 has a nitrided layer 10 formed by titanium nitrides (TiN) and/or aluminium-titanium nitrides ($AlTiN_2$), the nitrided layer 10 being obtained by means of a nitriding process by laser remelting carried out in a nitrogen-rich atmosphere and having high hardness, providing the titanium valve 1 with excellent wear resistance.

As stated above, high-speed engines result in high levels of inertia in the movement of the valves, causing excessive wear of the components. For this reason, high-speed engines usually use valves made of a titanium-based material in order to reduce the weight of these components. However, titanium alone provides relatively limited wear resistance.

The valves used in internal-combustion engines are high-precision components installed in the cylinder head of the engine, that are used for different tasks and are subjected to high thermal and mechanical stresses.

On account of the different loads and stresses to which the valve is subjected, the structural design thereof is usually very similar. Thus, as shown in FIG. 1, a valve 1 comprises a disk-shaped head 2 having a seat region 3 and a neck region 4 that acts as a transition portion to a stem 5, the tip 6 of the valve 1 being positioned at the end of the stem opposite the head. Furthermore, there are one or more recesses that form the channels 7 in the valve 1 in the region of the stem 5 next to the tip 6 of the valve 1. Each region of the valve 1 is subjected to different working loads and is therefore stressed in a distinct way.

There are conventional titanium nitriding methods in the prior art, for example gas nitriding, that typically result in nitrided layers that are up to 30 microns thick. Valves with thin layers have reduced durability.

Unlike the valves obtained traditionally using nitriding methods, the valve 1 according to the present invention has a nitrided layer 10, shown in FIG. 2, made of titanium nitrides (TiN) and/or aluminium-titanium nitrides ($AlTiN_2$) with a high nitride content provided on the surface of the valve 1 and throughout the thickness of the nitrided layer 10.

The valve 1 according to the present invention includes a body or substrate 8 preferably made of an alloy containing between 5.5% and 6.75% by weight of aluminium, and between 3.5% and 4.5% by weight of vanadium, the remainder being titanium and impurities, the alloy being known commercially as Ti6Al4V.

In a second preferred embodiment, the substrate 8 is made of an alloy that contains between 5.5% and 6.75% by weight of aluminium, between 1.30% and 2.00% by weight of iron, between 0.07% and 0.13% by weight of silicon, and between 0.15% and 0.20% by weight of oxygen, the remainder being titanium and impurities, the alloy being known commercially as Ti6Al2Fe0.1Si.

In a third preferred embodiment, the substrate 8 is made of an alloy containing between 5.5% and 6.75% by weight of aluminium, between 2.4% and 3.00% by weight of tin, between 3.50% and 4.50% by weight of zirconium, between 0.35% and 0.50% by weight of silicon, and between 0.35% and 0.50% by weight of molybdenum, the remainder being titanium and impurities, the alloy being known commercially as Ti6Al2.8Sn4Zr0.4Si.

In a fourth preferred embodiment, the substrate 8 is made of an alloy that contains between 5.5% and 6.75% by weight of aluminium, between 1.80% and 2.20% by weight of tin, between 3.60% and 4.40% by weight of zirconium, between 0.06% and 0.13% by weight of silicon, and between 1.80% and 2.20% by weight of molybdenum, the remainder being titanium and impurities, the alloy being known commercially as Ti6Al2Sn4Zr2Mo.

Being an aluminium-titanium alloy, both titanium nitrides (TiN) and aluminium-titanium nitrides ($AlTiN_2$) are formed. It is also possible for nitrides to form from the other elements contained in the alloy. However, these nitrides are much more difficult to obtain and no such formation was observed in any relevant quantities for the method parameters used. For these specific alloys, titanium nitrides (TiN) and/or aluminium-titanium nitrides ($AlTiN_2$) are necessarily formed.

The high-wear-resistance nitrided layer 10 is defined by a predominance of titanium nitrides (TiN) and/or aluminium-titanium nitrides ($AlTiN_2$) and is obtained by means of a nitriding process by laser remelting of the titanium alloy in a nitrogen-rich atmosphere, preferably containing at least 50% by volume of nitrogen.

The method for obtaining the nitrided layer 10, applied to the surface of at least one region of the valve 1, is done by means of a laser, the treatment essentially involving remelting the titanium alloy in a nitrogen-rich atmosphere to form nitrides. The laser generates a treated remelted layer that is very rich in titanium nitrides (TiN) and/or aluminium-titanium nitrides ($AlTiN_2$). Preferably, although not necessarily, the nitrided layer 10 is applied to the region of the tip 6 of the valve 1, and may be applied to all of the surfaces of the valve 1.

The method for manufacturing the valve 1 according to the present invention includes steps for forging and machining the shape of the valve 1, followed by an optional step of thermal oxidation, polishing of the tip 6 of the valve 1, laser remelting in a nitrogen-rich atmosphere and finally a machining finishing step to ensure a suitable roughness of the surface of the tip 6.

The nitriding carried out by laser remelting in a nitrogen atmosphere enables nitrides to form without the need for a thermal treatment, making the process quicker and able to be localized, i.e. the nitriding need not be applied to all of the surfaces of the valve 1, but only to the regions subject to the greatest wear. As well as being quick, the method achieves high thicknesses of the nitride layer, with layers of up to 500 microns thick and with high hardness and high nitride content being able to be obtained, this enabling a finishing method to be carried out.

Alternatively, the nitrided layer 10 is obtained using a nitriding process by remelting in a nitrogen-rich atmosphere, the remelting process being carried out with a tungsten electrode (TIG—tungsten inert gas) or else using an electron beam (EBW—electron beam welding), both processes being carried out in atmospheres containing at least 50% by volume of nitrogen.

A comparative study of the parameters of the laser remelting process was carried out to assess the characteristics of the nitrided layer 10 as a function of the nitrogen atmosphere.

Preferably, but not necessarily, the process used a laser beam with a diameter of between 0.5 and 6 millimetres, preferably 0.5 millimetres, an angle of incidence of the laser of between 75° and 110°, preferably 90°, a laser speed of between 5.0 and 60 mm/s (millimetres per second), preferably 8.0 mm/s, and a laser power of between 200 and 3000 watts, preferably 300 watts.

Two samples were prepared, in which a first sample, hereinafter referred to as sample A, was subjected to a laser remelting process in a nitrogen-rich atmosphere with a minimum nitrogen flow of 8 l/min (litres per minute), preferably between 10 l/min and 15 l/min, and a second sample, hereinafter referred to as sample B, was subjected to the same laser remelting process, but with no nitrogen-rich atmosphere, i.e. with zero nitrogen flow.

FIG. 3 is a photograph of the nitrided layer 10 obtained with sample A, and FIG. 4 is a photograph of the nitrided layer 10 obtained with sample B.

For both samples A and B, with and without nitrogen respectively, a nitrided layer 10 between 150 and 500 microns deep, preferably between 200 and 300 microns deep, was obtained, with a maximum surface deformation of 20 microns.

The B samples, treated without a nitrogen atmosphere, had surface cracks and therefore lower wear resistance. A comparative analysis by wavelength dispersive X-ray (WDX) shows a higher incorporation of nitrogen, up to 10% by weight of nitrogen, on the surface of the tip 6 of the valve 1 of the present invention when a nitrogen atmosphere is used (sample A). Conversely, a greater quantity of oxygen, up to 13% by weight of oxygen, is incorporated when a nitrogen atmosphere is not used (sample B).

The high temperature and the high heat extraction given by the laser source associated with the high incorporation of nitrogen or of oxygen led to an excellent increase in surface hardness from 380 HV to 2000 HV (Vickers hardness). The hardness obtained on the surface of the tip 6 of the valve 1 is between 1100 HV and 2000 HV, while the hardness obtained at a depth of 200 microns into the thickness of the nitrided layer 10 is at least 700 HV, as shown in FIG. 5.

A detailed X-ray diffraction (XRD) analysis through the depth of the nitrided layer 10 revealed the predominance of titanium nitrides (TiN) and/or aluminium-titanium nitrides ($AlTiN_2$) formed on the tip 6 of the valve 1 of the present invention treated in a nitrogen-rich atmosphere (sample A).

On the other hand, the B samples, treated without a nitrogen atmosphere, conversely showed a predominance of titanium oxides (TiO), with almost no nitrides.

The analysis carried out confirmed the existence of nitrides on the surface of the tip 6 of the valve 1 and a study was performed of how the nitrides behave through the depth of the nitrided layer 10, to enable the nitrided layer 10 to have improved wear resistance.

This study revealed that it is possible to obtain at least 50% by volume of titanium nitrides (TiN) and/or aluminium-titanium nitrides ($AlTiN_2$) to a depth of up to at least 50 microns in the thickness of the nitrided layer 10. In other words, the combination of the two nitrides (titanium and aluminium-titanium) to a depth of at least 50 microns in the thickness of the nitrided layer 10, can guarantee the existence of at least 50% by volume of nitrides.

The graph in FIG. 6 shows the content of the phases found through the depth of the thickness of the nitrided layer 10. Sample A, treated with a nitrogen atmosphere, had at least 35% of titanium nitrides (TiN) and at least 47% of aluminium-titanium nitrides (AlTi2), containing at least 82% of nitrides (TiN+AlTiN$_2$) on the surface of the nitrided layer 10. Furthermore, sample A had at least 50% by volume of titanium nitrides (TiN) and at least 19% by volume of aluminium-titanium nitrides (AlTiN$_2$), containing at least 69% of nitrides (TiN+AlTiN$_2$) to a depth of at least 50 microns in the thickness of the nitrided layer 10.

Conversely, sample B, treated in an atmosphere without nitrogen, had just 16% of titanium nitrides (TiN) and a predominance of 82% of titanium oxides (TiO) on the surface of the nitrided layer 10, and 38% of titanium nitrides and/or titanium aluminium nitrides (TiN and/or AlTiN$_2$) with a predominance of 48% of titanium oxides (TiO) to a depth of at least 50 microns in the thickness of the nitrided layer 10.

The application of the laser in an environment that includes nitrogen ensures the formation of nitrides through the depth of the thickness of the nitrided layer 10.

FIGS. 7 and 8 show that the resulting wear of the nitrided-steel valves (prior art) and the titanium valves treated by remelting (present invention) was similar, around 2.1 to 2.8 microns.

Figure 1:
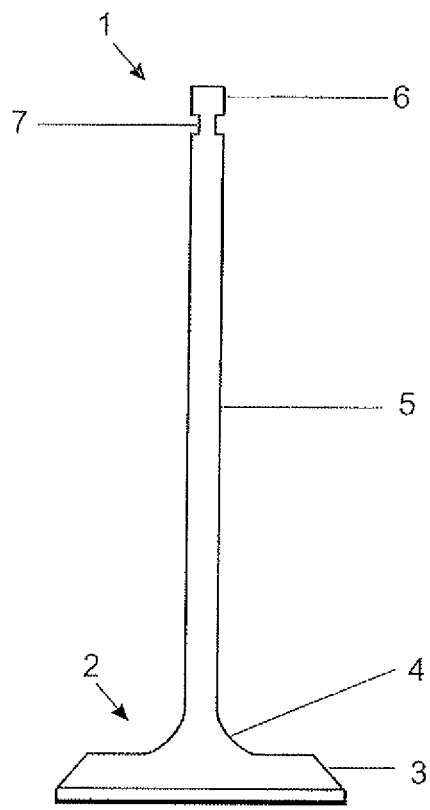
Figure 2:
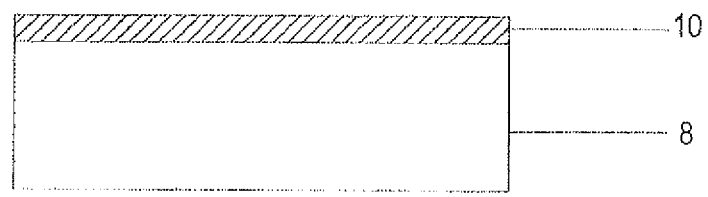
Figure 3:
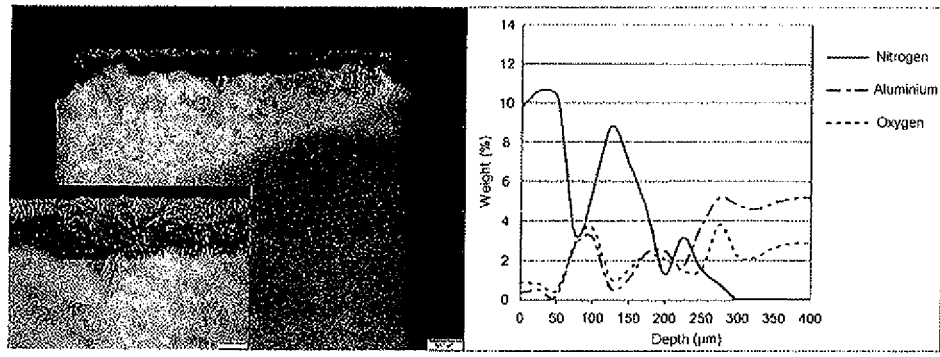
Figure 4:
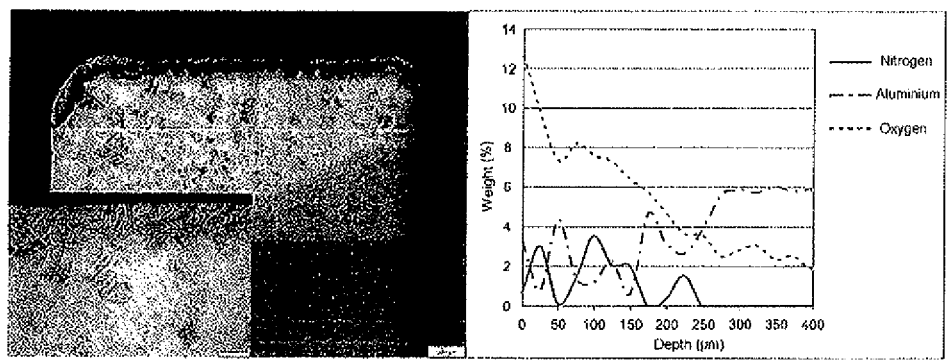
Figure 5:
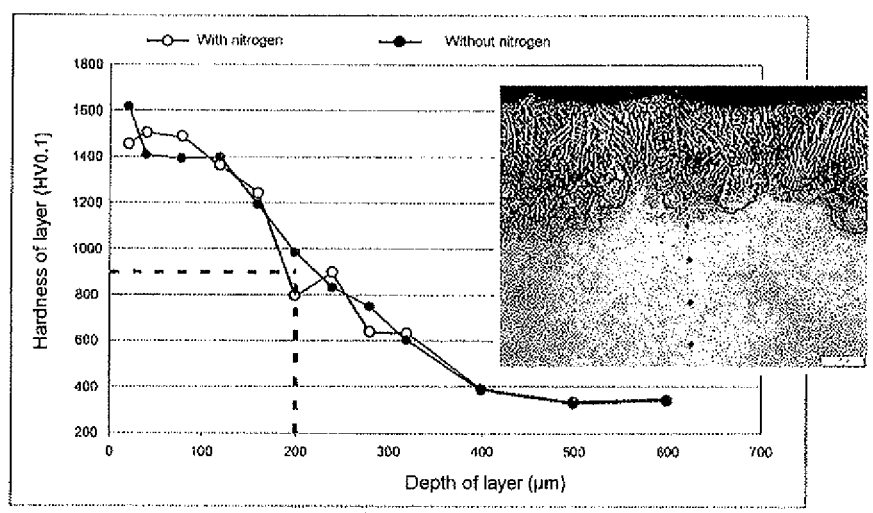
Figure 6:
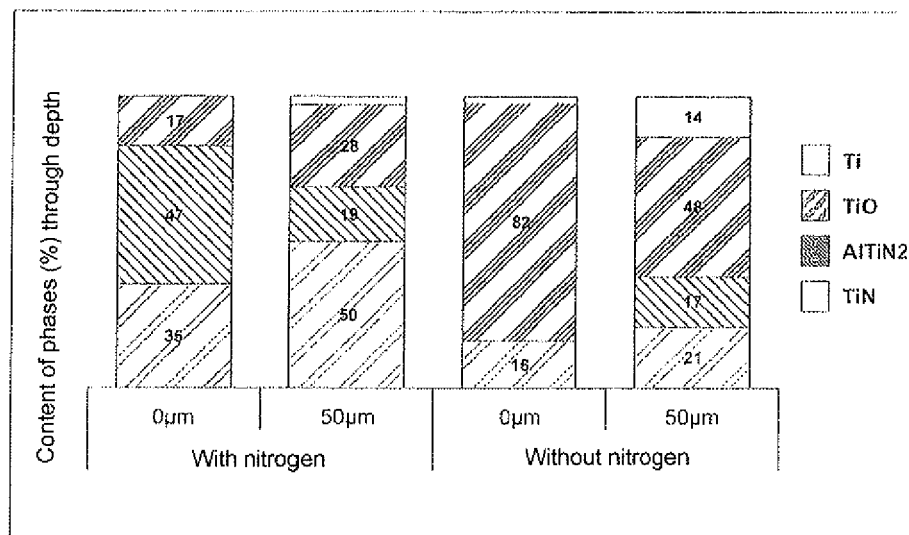
Figure 7:
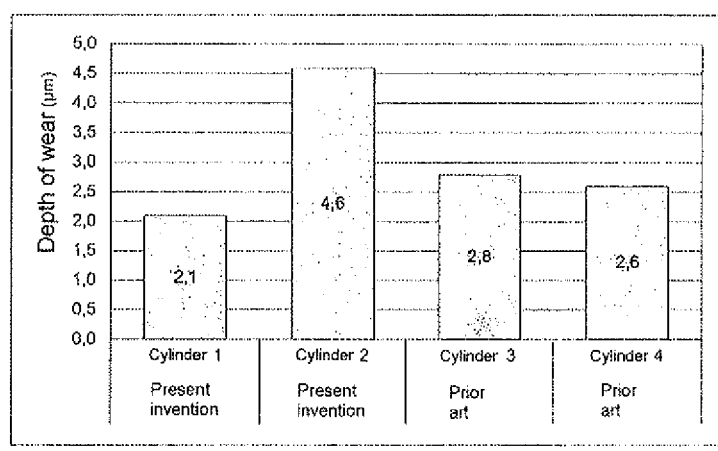
FIGS. 7 and 8 show the graphical results obtained from a durability test carried out in order to measure the resulting depth of wear for valves in the prior art that include nitrided steel, obtained by induction hardening, and the titanium valves according to the present invention that include the nitrided layer 10 obtained by the remelting process.
Figure 8:
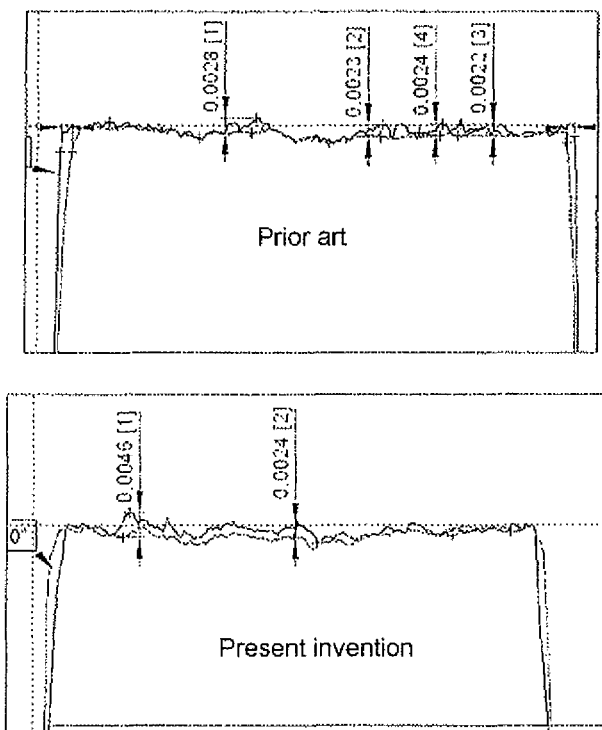

As can be seen in FIG. 8, the valve 1 according to the present invention has a single region of greater wear, up to 4.6 microns, which is nonetheless very advantageous and enables the replacement of the steel lash cap on the tip of the valve. The other valves show wear similar to the treated-steel valve, i.e. less than 2.8 microns in the other regions of the surface thereof.

Consequently, it can be confirmed that the presence of large quantities of titanium nitrides and/or aluminium-titanium nitrides on the surface of the tip 6 of the valve 1 provides high wear resistance, achieving wear resistance similar to valves made of hardened steels, but with less weight on account of the use of a titanium alloy. Furthermore, the valve 1 according to the present invention can achieve the same strength as a titanium valve that uses the steel lash cap.

Figure 9:
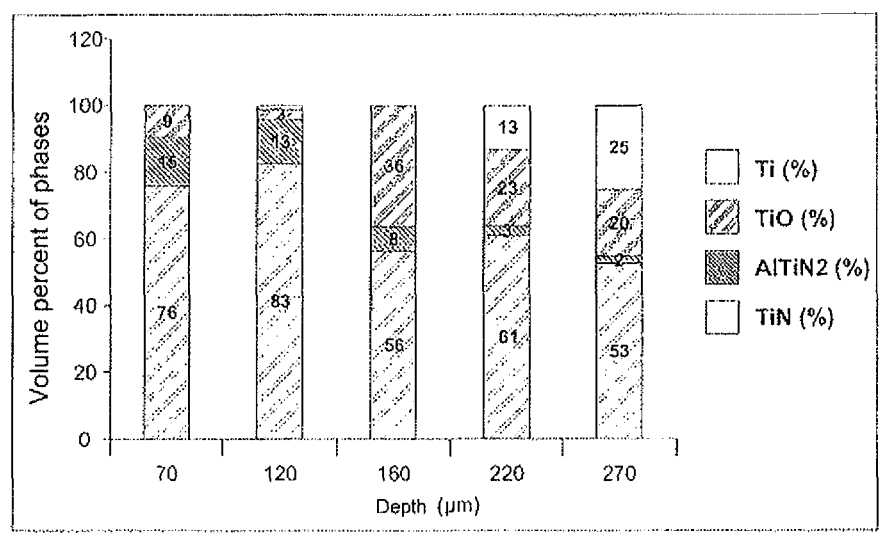

Finally, FIG. 9 shows graphical results for an analysis carried out by X-ray diffraction, demonstrating that the wear resistance is guaranteed up to approximately 270 microns from the treated surface, since same has at least 50% of hard nitride phases, such as TiN and AlTiN$_2$.

This replacement of the steel lash cap with the nitrided layer 10 has advantages in terms of the method, since same comprises just one part and one step, as well as advantages in terms of the product on account of the elimination of the steel lash cap, which is liable to become detached and to cause damage to the engine.

Although a preferred embodiment has been described, it should be noted that the scope of the present invention covers other possible variations and is only limited by the content of the attached claims, including the possible equivalents therein.

The invention claimed is:

1. A valve for an internal-combustion engine comprising a body including a titanium alloy, wherein:
   at least one region of the body includes a nitrided layer including at least one of titanium nitrides and aluminium-titanium nitrides; and
   the nitrided layer includes at least 50% by volume of the at least one of titanium nitrides and aluminium-titanium nitrides to a depth of 50 microns or more in a thickness of the nitrided layer.

2. The valve according to claim 1, wherein the thickness of the nitrided layer is 500 microns or less.

3. The valve according to claim 1, wherein a surface hardness of the nitrided layer is from 1100 HV to 2000 HV.

4. The valve according to claim 1, wherein a hardness of the nitrided layer is 700 HV or more to a depth of 200 microns or more in the thickness of the nitrided layer.

5. The valve according to claim 1, wherein all surfaces of the body include the nitrided layer.

6. The valve according to claim 1, wherein the at least one region includes a region corresponding to a tip of the body.

7. The valve according to claim 1, wherein the body is composed of the titanium alloy that contains 5.5% by weight to 6.75% by weight of aluminium, 3.5% by weight to 4.5% by weight of vanadium, and a remainder of titanium and impurities.

8. The valve according to claim 1, wherein the body is composed of the titanium alloy that contains 5.5% by weight to 6.75% by weight of aluminium, 1.30% by weight to 2.00% by weight of iron, 0.07% by weight to 0.13% by weight of silicon, 0.15% by weight to 0.20% by weight of oxygen, and a remainder of titanium and impurities.

9. The valve according to claim 1, wherein the body is composed of the titanium alloy that contains 5.5% by weight to 6.75% by weight of aluminium, 2.4% by weight to 3.00% by weight of tin, 3.50% by weight to 4.50% by weight of zirconium, 0.35% by weight to 0.50% by weight of silicon, 0.35% by weight to 0.50% by weight of molybdenum, and a remainder of titanium and impurities.

10. The valve according to claim 1, wherein the body is composed of the titanium alloy that contains 5.5% by weight to 6.75% by weight of aluminium, 1.80% by weight to 2.20% by weight of tin, 3.60% by weight to 4.40% by weight of zirconium, 0.06% by weight to 0.13% by weight of silicon, 1.80% by weight to 2.20% by weight of molybdenum, and a remainder of titanium and impurities.

11. The valve according to claim 1, wherein the valve is an intake valve.

12. A method for obtaining a valve for an internal-combustion engine, comprising:
   forging and machining a body composed of a titanium alloy to a shape of the valve;
   producing a nitrided layer including at least 50% by volume of at least one of titanium nitrides and aluminium-titanium nitrides to a depth of 50 microns or more in a thickness of the nitrided layer via nitriding at least one region of the body;
   finishing the body via machining; and
   wherein producing the nitrided layer via nitriding includes laser remelting in a nitrogen-rich atmosphere.

13. The method according to claim 12, further comprising performing a thermal oxidation process and a polishing process on at least one region of the body after forging and machining the body and before producing the nitrided layer.

14. The method according to claim 12, wherein the nitrogen-rich atmosphere is composed of 50% by volume or more of nitrogen.

15. The method according to claim 12, wherein laser remelting includes applying a laser beam with a diameter of 0.5 millimetres to 6.0 millimetres at an angle of incidence of 75° to 110° with a laser speed of 5.0 millimetres per second to 60 millimetres per second and a laser power of 200 watts to 3000 watts to the body, and wherein the nitrogen-rich atmosphere has a nitrogen flow of 8 litres per minute or more.

16. The method according to claim 12, wherein finishing the body via machining includes removing material from a treated surface to a depth of 70 microns or less.

17. An internal-combustion engine, comprising at least one valve including a body, the body including a titanium alloy and at least one region having a nitrided layer, wherein:
    the nitrided layer includes at least one of titanium nitrides and aluminium-titanium nitrides; and
    the thickness of the nitrided layer is 150 microns to 300 microns.

18. The valve according to claim 2, wherein a hardness of the nitrided layer is 700 HV or more to a depth of 200 microns or more in the thickness of the nitrided layer.

19. The valve according to claim 1, wherein the thickness of the nitrided layer is 150 microns to 300 microns.

20. The valve according to claim 1, wherein the nitrided layer has a hardness of 800 HV at a depth of 200 microns in the thickness of the nitrided layer.

* * * * *